United States Patent
Okamura et al.

(10) Patent No.: US 10,222,689 B2
(45) Date of Patent: *Mar. 5, 2019

(54) MASK BLANK

(71) Applicant: AGC INC., Chiyoda-ku (JP)

(72) Inventors: Yuzo Okamura, Tokyo (JP); Yusuke Hirabayashi, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/897,612

(22) Filed: Feb. 15, 2018

(65) Prior Publication Data

US 2018/0239236 A1    Aug. 23, 2018

(30) Foreign Application Priority Data

Feb. 22, 2017    (JP) .................................. 2017-031497

(51) Int. Cl.
| | | |
|---|---|---|
| *G03F 1/50* | (2012.01) | |
| *G03F 1/24* | (2012.01) | |
| *G03F 1/60* | (2012.01) | |
| *G03F 1/54* | (2012.01) | |
| *G03F 1/48* | (2012.01) | |
| *G03F 1/52* | (2012.01) | |

(52) U.S. Cl.
CPC .................. *G03F 1/24* (2013.01); *G03F 1/48* (2013.01); *G03F 1/52* (2013.01); *G03F 1/54* (2013.01); *G03F 1/60* (2013.01)

(58) Field of Classification Search
CPC ..... G03F 1/60; G03F 1/48; G03F 1/52; G03F 1/54
USPC .......................................................... 430/5
See application file for complete search history.

(56) References Cited

U.S. PATENT DOCUMENTS

| | | | | |
|---|---|---|---|---|
| 2008/0268352 | A1* | 10/2008 | Takai ..................... | B82Y 10/00 430/5 |
| 2016/0109797 | A1* | 4/2016 | Tanabe ..................... | G03F 1/60 430/5 |
| 2016/0357100 | A1* | 12/2016 | Ikuta ......................... | G03F 1/24 |
| 2017/0363952 | A1* | 12/2017 | Ikebe ........................ | G03F 1/60 |

FOREIGN PATENT DOCUMENTS

| | | | |
|---|---|---|---|
| JP | 2013-043238 A | * | 3/2013 |
| JP | 2014-199847 | | 10/2014 |
| JP | 2016-4821 | | 1/2016 |
| JP | 5880449 | | 3/2016 |

OTHER PUBLICATIONS

Computer-generated translation of JP 2013-043238 (Mar. 2013).*

* cited by examiner

*Primary Examiner* — John A McPherson
(74) *Attorney, Agent, or Firm* — Oblon, McClelland, Maier & Neustadt, L.L.P.

(57) ABSTRACT

A mask blank includes a glass substrate including a first main surface and a second main surface, an absorbing film formed above the first main surface, and a conductive film formed on the second main surface. A reflective film is provided between the absorbing film and the glass substrate. In a surface of the conductive film on an opposite side to the glass substrate, when a surface shape of a square central area having a length of 142 mm and a width of 142 mm excluding a four-sided frame-shaped peripheral area thereof is expressed by the specific formula, flatness of a component obtained by summing all $a_{kl}P_k(x)P_l(y)$ with the sum of k and l being 3 or more and 25 or less is 20 nm or less.

12 Claims, 6 Drawing Sheets

MASK BLANK

CROSS-REFERENCE TO RELATED APPLICATIONS

This application claims priority from Japanese Patent Application No. 2017-031497 filed on Feb. 22, 2017, the entire subject matter of which is incorporated herein by reference.

BACKGROUND OF THE INVENTION

Technical Field

The present invention relates to a mask blank, particularly relates to a reflective mask blank for EUV (Extreme Ultra Violet) lithography (EUVL) using EUV light.

Background Art

A mask blank includes a glass substrate having a first main surface and a second main surface, a film formed on/above the first main surface of the glass substrate, and a conductive film formed on/above the second main surface of the glass substrate. At least a reflective film that reflects light and an absorbing film that absorbs light are formed in this order on/above the first main surface. A photomask can be obtained by forming a circuit pattern in the absorbing film and the like.

The mask blank has a first main surface where the circuit pattern is to be formed, and a second main surface which is to be adsorbed by an electrostatic chuck. The adsorption surface of the mask blank is the main surface of the conductive film on the opposite side to the glass substrate. The adsorption surface of the mask blank is adsorbed by a flat surface of the electrostatic chuck so as to follow the flat surface.

The first main surface and second main surface of the mask blank are required to have high flatness so that distortion of the circuit pattern of the photomask can fall within an allowable range. In particular, in the first main surface, a central area where the circuit pattern is to be formed is required to have high flatness. In the same manner, a central area of the second main surface is also required to have high flatness in order to suppress deformation during electrostatic adsorption to thereby suppress distortion of the circuit pattern.

The flatness in the first main surface of the mask blank depends on flatness in a first main surface of the glass substrate, a warp generated during deposition of films such as the reflective film, the adsorbing film, and the conductive film. In the same manner, the flatness in the second main surface of the mask blank depends on flatness in a second main surface of the glass substrate, a warp generated during deposition of films such as the reflective film, the adsorbing film, and the conductive film.

The flatness in the glass substrate for a mask blank or the flatness in the mask blank is usually measured by means of an optical interferometer (see, for example, Patent Literature 1). With the optical interferometer, height from a reference plane is measured at each measurement point of a measurement surface. A maximum height difference in the measured surface is called flatness.

Patent Literature 1: JP 5880449 B2

SUMMARY OF THE INVENTION

There has been conventionally a recognition that the flatness in a second main surface of a mask blank (that is, an adsorption surface of a photomask) may be correlated with the pattern overlaying accuracy of a photomask produced by use of the mask blank. However, optimal flatness in the second main surface has not been found out.

The present invention has been made in consideration of the aforementioned problem, and a main object thereof is to provide a mask blank capable of providing a photomask with a good pattern overlaying accuracy.

An aspect of the present invention provides a mask blank including:

a glass substrate including a first main surface and a second main surface facing the first main surface;

a film formed above the first main surface, the film being a film where a circuit pattern is to be formed; and a conductive film formed on the second main surface; wherein:

the film where the circuit pattern is to be formed is an absorbing film that absorbs light;

a reflective film that reflects the light is provided between the absorbing film and the glass substrate; and in a surface of the conductive film on an opposite side to the glass substrate, when a surface shape of a square central area having a length of 142 mm and a width of 142 mm excluding a four-sided frame-shaped peripheral area thereof is expressed by the following formula, flatness of a component obtained by summing all $a_{kl}P_k(x)P_l(y)$ with the sum of k and l in the following formula being 3 or more and 25 or less is 20 nm or less.

$$\begin{cases} z(x, y) = \sum_{k=0}^{N_1} \sum_{l=0}^{N_2} a_{kl} P_k(x) P_l(y) \\ P_k(x) = \frac{1}{2^k k!} \frac{d^k}{dx^k} \left[ (x^2 - 1)^k \right] \\ P_l(y) = \frac{1}{2^l l!} \frac{d^l}{dy^l} \left[ (y^2 - 1)^l \right] \end{cases}$$

In the formula above, x indicates a coordinate in a transverse direction, y indicates a coordinate in a longitudinal direction, and z indicates a coordinate in a height direction, the transverse direction, the longitudinal direction and the height direction being perpendicular to each other, and each of k and l is a natural number of 0 or more and 25 or less, the sum of k and l is 3 or more and 25 or less, and each of N1 and N2 is 25.

An aspect of the present invention provides a mask blank capable of producing a photomask with good pattern overlaying accuracy.

DETAILED DESCRIPTION OF THE INVENTION

Figure 1:
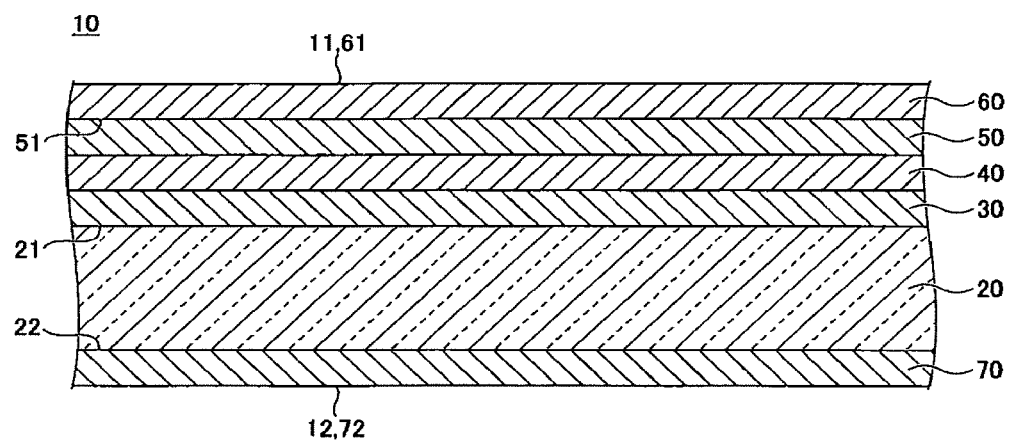
FIG. 1 is a view of a mask blank in one embodiment.

Embodiments for carrying out the present invention will be described below with reference to the drawings. In the drawings, the same or corresponding configuration is denoted by the same or corresponding reference numeral or sign, and the description thereof will be omitted. In the description, a "rectangular or square" shape encompasses: a rectangle; a square; and a rectangle or square having chamfered corners.

<Mask Blank>

FIG. 1 shows a view of a mask blank in one embodiment. The mask blank 10 illustrated in FIG. 1 is a reflective mask blank which includes a glass substrate 20, a reflective film 30, a protective film 40, an absorbing film 50, a low reflective film 60, and a conductive film 70.

The glass substrate 20 has a first main surface 21, and a second main surface 22 facing the first main surface 21. The reflective film 30, the protective film 40, the absorbing film 50, and the low reflective film 60 are formed, in this order, on/above the first main surface 21 of the glass substrate 20. On the other hand, the conductive film 70 is formed on the second main surface 22 of the glass substrate 20.

The glass of the glass substrate 20 is preferably quartz glass containing 90 mass % or more of $SiO_2$. The upper limit of the $SiO_2$ content in the quartz glass is 100 mass %. As compared with general soda lime glass, the quartz glass has a small coefficient of linear expansion and causes a small dimensional change due to temperature change. The quartz glass may contain $TiO_2$ in addition to $SiO_2$. The quartz glass may contain from 90 to 95 mass % of $SiO_2$ and from 5 to 10 mass % of $TiO_2$. When the $TiO_2$ content is from 5 to 10 mass %, the coefficient of linear expansion near room temperature is substantially zero, and almost no dimensional change occurs near room temperature. The quartz glass may contain trace ingredient(s) other than $SiO_2$ and $TiO_2$, but it is preferable not to contain trace ingredient(s).

The reflective film 30 reflects light such as EUV (Extreme Ultra Violet). The reflective film 30 may be, for example, a multilayer reflective film where a high refractive index layer and a low refractive index layer are alternately stacked. The high refractive index layer is formed of, for example, silicon (Si), and the low refractive index layer is formed of, for example, molybdenum (Mo). The reflective film 30 is, for example, deposited by using a sputtering method such as an ion beam sputtering method or a magnetron sputtering method.

The protective film 40 protects the reflective film 30 from etching for forming a circuit pattern 53 (see FIG. 2) in the absorbing film 50. The protective film 40 is formed of, for example, Ru, Si, $TiO_2$, or the like. The protective film 40 is, for example, deposited by using a sputtering method. The protective film 40 is an optional configuration, which may not be provided.

The absorbing film 50 absorbs light such as EUV. The absorbing film 50 is formed of, for example, a monometal, an alloy, a nitride, an oxide, or an oxynitride, containing at least one element selected from tantalum (Ta), chromium (Cr) and palladium (Pd). The absorbing film 50 is, for example, deposited by using a sputtering method. The absorbing film 50 is a film where the circuit pattern 53 (see FIG. 2) is to be formed.

The low reflective film 60 is a film where a circuit pattern 63 (see FIG. 2) is to be formed, in the same manner as the absorbing film 50. The low reflective film 60 has lower reflective properties for inspection light of the circuit patterns 53 and 63 than the absorbing film 50. The low reflective film 60 is formed of, for example, TaON, TaO, or the like. The low reflective film 60 is, for example, deposited by using a sputtering method. The low reflective film 60 is an optional configuration, which may not be provided.

Due to the conductive film 70, a photomask can be electrostatically adsorbed by an electrostatic chuck of an exposure machine. The conductive film 70 is formed of, for example, chromium nitride (CrN). The conductive film 70 is, for example, deposited by a sputtering method.

The first main surface 11 of the mask blank 10 is a surface where a circuit pattern is to be formed by a photolithography method, an etching method, etc. In the mask blank 10 having the aforementioned configuration, a main surface 61 of the low reflective film 60 on the opposite side to the glass substrate 20 corresponds to the first main surface 11 of the mask blank 10. As described above, the low reflective film 60 may not be provided, and in this case, a main surface 51 of the absorbing film 50 on the opposite side to the glass substrate 20 corresponds to the first main surface of the mask blank. In the following description, the first main surface 11 of the mask blank 10 will be also referred to as a circuit pattern-forming surface 11.

On the other hand, the second main surface 12 of the mask blank 10 is a surface which is to be adsorbed by the electrostatic chuck. In the mask blank 10 having the aforementioned configuration, a main surface 72 of the conductive film 70 on the opposite side to the glass substrate 20 corresponds to the second main surface 12 of the mask blank. In the following description, the second main surface 12 of the mask blank 10 will be also referred to as an adsorption surface 12.

<Photomask>

Figure 2:
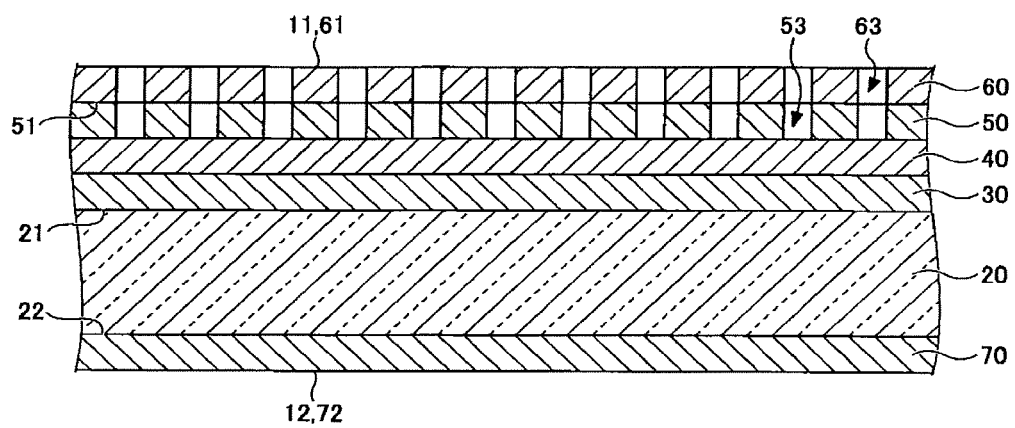
FIG. 2 is a view of a photomask in one embodiment.

FIG. 2 shows a view of a photomask in one embodiment. The photomask illustrated in FIG. 2 is obtained by forming circuit patterns 63 and 53 in the circuit pattern-forming surface 11 of the mask blank 10 illustrated in FIG. 1. The circuit patterns 63 and 53 are formed by using a photolithography method or an etching method. Resist films used for forming the circuit patterns 63 and 53 may be included in the mask blank.

The photomask illustrated in FIG. 2 is a reflective photomask which includes the glass substrate 20, the reflective film 30, the protective film 40, the absorbing film 50 where the circuit pattern 53 has been formed, the low reflective film 60 where the circuit pattern 63 has been formed, and the conductive film 70. As described above, the protective film 40 and the low reflective film 60 are optional configurations, which may not be provided.

The photomask is mounted, for example, on an exposure machine having an EUV light source. The exposure machine can adsorb a reflective photomask with its electrostatic chuck. The main surface 72 of the conductive film 70 on the opposite side to the glass substrate 20 is adsorbed by a flat surface of the electrostatic chuck so as to follow the flat surface.

<Shape of Adsorption Surface of Mask Blank>

Figure 3:
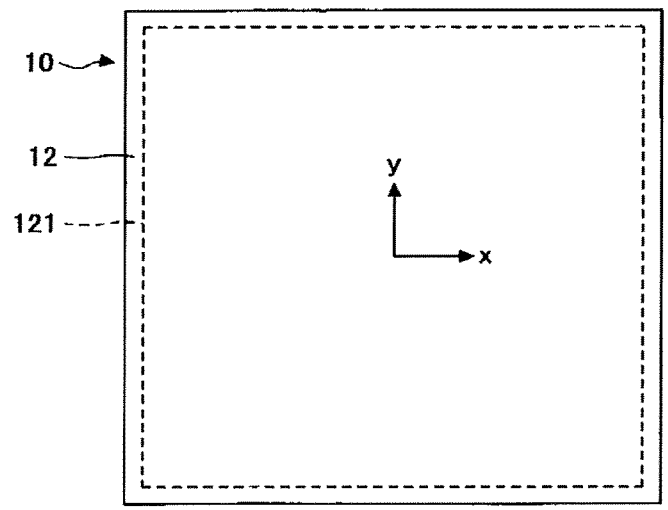
FIG. 3 is a plan view of an adsorption surface of the mask blank in one embodiment.

FIG. 3 shows a plan view of an adsorption surface of the mask blank in one embodiment. In FIG. 3, x direction is a transverse direction, y direction is a longitudinal direction, and the x direction and the y direction are directions running at right angles to each other. As illustrated in FIG. 3, the adsorption surface 12 of the mask blank 10 is rectangular or square.

The adsorption surface 12 has, for example, a rectangular or square shape of 152 mm in length and 152 mm in width. A square area having a length of 142 mm and a width of 142 mm of the adsorption surface 12 excluding the four-sided frame-shaped peripheral area will be referred to as a central area 121. The center of the central area 121 coincides with the center of the adsorption surface 12.

The longitudinal dimension of the adsorption surface 12 may be 152 mm or more. The transversal dimension of the adsorption surface 12 may be 152 mm or more. Even in these cases, the square area having a length of 142 mm and a width of 142 mm of the adsorption surface 12 excluding the peripheral area is called a central area 121.

The surface shape of the central area 121 of the adsorption surface 12 is expressed by the following formula.

$$\begin{cases} z(x, y) = \sum_{k=0}^{N_1} \sum_{l=0}^{N_2} a_{kl} P_k(x) P_l(y) \\ P_k(x) = \frac{1}{2^k k!} \frac{d^k}{dx^k}\left[(x^2 - 1)^k\right] \\ P_l(y) = \frac{1}{2^l l!} \frac{d^l}{dy^l}\left[(y^2 - 1)^l\right] \end{cases}$$

In the formula above, x indicates a coordinate in the transverse direction, y indicates a coordinate in the longitudinal direction, and z indicates a coordinate in the height direction, and the transverse direction, the longitudinal direction and the height direction are perpendicular to each other. In addition, in the formula above, each of k and l is a natural number of 0 or more. Generally, $P_k(x)$ and $P_l(y)$ are called a Legendre polynomial. The Legendre polynomial is an orthogonal polynomial and therefore, the value of coefficient $a_{kl}$ does not depend on N1 or N2. Hereinafter, the sum of k and l will be referred to as degree m (m=k+l).

Figure 4:
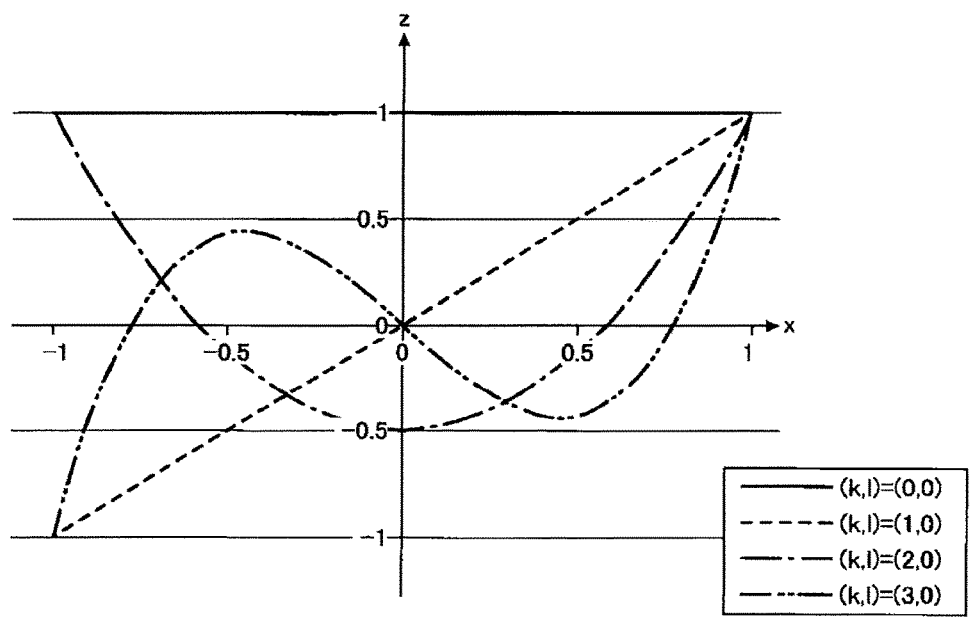
FIG. 4 is a view of a surface shape expressed by $P_k(x)P_l(y)$ in the case of degree m of 0, 1, 2 and 3.

FIG. 4 is a view of the surface shape expressed by $P_k(x)P_l(y)$ in the case of degree m of 0, 1, 2 and 3. FIG. 4 representatively illustrates a surface shape expressed by $P_k(x)P_l(y)$ for combinations (k,l) of (0,0), (1,0), (2,0) and (3,0).

Figure 5:
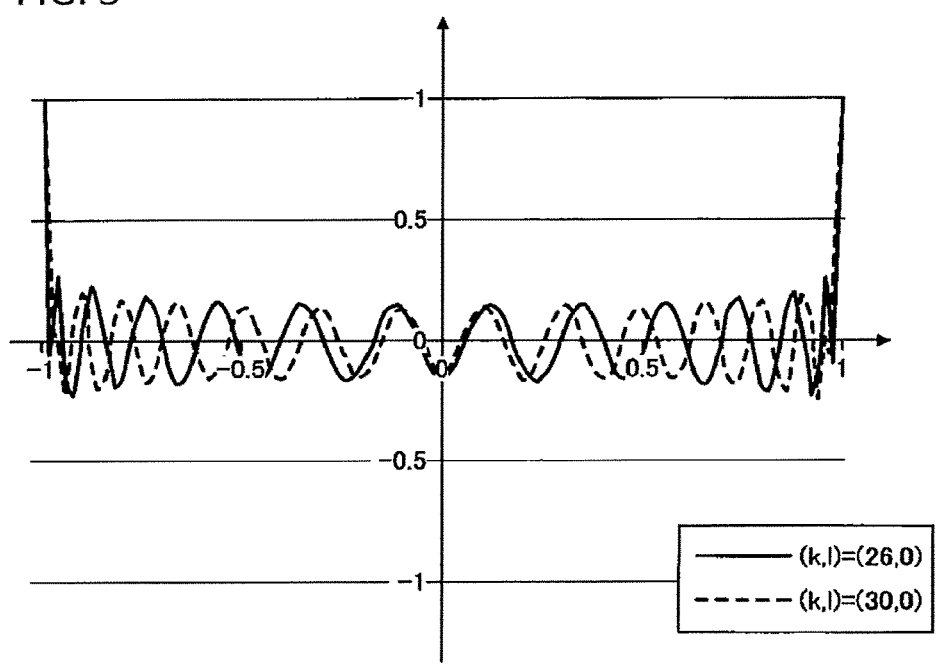
FIG. 5 is a view of a surface shape expressed by $P_k(x)P_l(y)$ in the case of degree m of 26 and 30.

FIG. 5 shows a view of the surface shape expressed by $P_k(x)P_l(y)$ of degree m of 26 and 30. FIG. 5 representatively illustrates a surface shape expressed by $P_k(x)P_l(y)$ for combinations (k,l) of (26,0) and (30,0).

As described below in detail, the present inventors have found that when the flatness of a component obtained by summing all $a_{kl}P_k(x)P_l(y)$ of degree m of 3 or more and 25 or less is reduced to 20 nm or less in the central area 121 of the adsorption surface 12, it is possible to obtain a photomask with good pattern overlaying accuracy (OPD: Out of Plane Distortion). The flatness is a maximum height difference, which is also referred to as a PV (Peak to Valley) value.

As denoted by a solid line in FIG. 4, the surface expressed by $P_k(x)P_l(y)$ in the case of degree m of 0 (zero) is an offset surface parallel to the xy-plane (z=0), and this is a plane surface and therefore, does not give rise to deformation of the central area 121 due to electrostatic adsorption.

As denoted by a broken line in FIG. 4, the surface expressed by $P_k(x)P_l(y)$ in the case of degree m of 1 is a plane surface inclined with respect to the xy-plane and therefore, does not give rise to deformation of the central area 121 due to electrostatic adsorption.

As denoted by a dash-dot line in FIG. 4, the surface expressed by $P_k(x)P_l(y)$ in the case of degree m of 2 is a curved surface and may give rise to deformation of the central area 121 due to electrostatic adsorption. However, the surface can be regarded as a surface having no effect on the pattern overlaying accuracy (OPD) for the reason which will be described later.

The component of degree m of 2 is a downward convex curved surface or an upward convex curved surface as illustrated in FIG. 4. Such a curved surface is considered to be a warp generated during deposition. The warp is, for example, generated by internal stress caused by a difference in thermal expansion between the glass substrate 20 and a film formed on the glass substrate 20.

Figure 6:
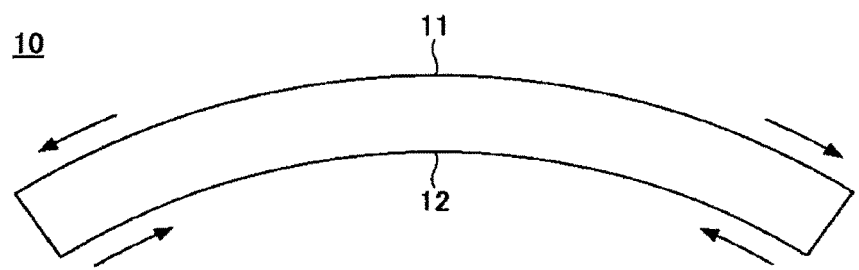
FIG. 6 is a view of a warp generated during deposition for producing the mask blank in one embodiment.

FIG. 6 shows a view of a warp generated during deposition of the mask blank in one embodiment. In FIG. 6, each arrow shows a direction of action of internal stress generated during deposition. In FIG. 6, compressive stress acts on the adsorption surface 12 and tensile stress acts on the circuit pattern-forming surface 11. However, the compressive stress and the tensile stress may be replaced by each other. That is, the tensile stress may act on the adsorption surface 12 and the compressive stress may act on the circuit pattern-forming surface 11.

As illustrated in FIG. 6, the adsorption surface 12 and the circuit pattern-forming surface 11 have the same warp generated during deposition. Therefore, when the adsorption surface 12 is adsorbed on a flat surface, both the adsorption surface 12 and the circuit pattern-forming surface 11 are corrected to be flat.

The component in the case of degree m of 2 in the central area 121 of the adsorption surface 12 and the component in the case of degree m of 2 in the central area 111 of the circuit pattern-forming surface 11 become curved surfaces having substantially the same shape. Therefore, both the components are corrected to be flat by electrostatic adsorption.

Therefore, in this embodiment, the component in the case of degree m of 2 in the central area 121 of the adsorption surface 12 is regarded as a component having no effect on the pattern overlaying accuracy (OPD). In the same manner, the component in the case of degree m of 2 in the central area 111 of the circuit pattern-forming surface 11 (see FIG. 8) is regarded as a component having no effect on the pattern overlaying accuracy (OPD).

As denoted by a dash-dot-dot line in FIG. 4, the surface expressed by $P_k(x)P_l(y)$ in the case of degree m of 3 is a curved surface and may give rise to deformation of the central area 121 due to electrostatic adsorption, and may have an effect on the pattern overlaying accuracy (OPD). The component that may have an effect on the pattern overlaying accuracy (OPD) is a component in the case of degree m of 3 or more.

On the other hand, the component in the case of degree m of 26 or more is a component having a short spatial wavelength as compared to the component in the case of degree m of 25 or less, and has therefore almost no effect on deformation of the central area 121 due to electrostatic adsorption. Deformation of the central area 121 due to electrostatic adsorption occurs because the convex and concave profile of the central area 121 tries to become flat following the adsorption surface by the electrostatic chuck. Assuming that the adsorptive power is uniform throughout the central area 121, the maximum amount of displacement between two points where peaks of two adjacent convexes of the central area 121 are point-contacted with the adsorption surface is calculated from the uniformly distributed loading conditions of a support beam fixed at both ends, and the maximum amount of displacement is then estimated to be proportional to the fourth power of the length of one wavelength. Since the length of one wavelength is inversely proportional to degree m, the maximum amount of displacement attributable to a component in the case of degree m of 26 is as sufficiently small as about ⅙,₀₀₀ of the maximum amount of displacement attributable to a component in the case of degree m of 3. Accordingly, the component in the case of degree m of 26 or more is considered to have almost no effect on the deformation of the central area 121 due to electrostatic adsorption, and considered to have almost no effect on the pattern overlaying accuracy (OPD).

In addition, the component in the case of degree m of 26 or more, that is, the component having a short spatial wavelength is apt to pick up measuring noise of an interferometer (for example, noise caused by vibration or temperature change, or optical noise). In addition, the pitch of measurement points to be measured by the interferometer is within a range of from 0.1 to 1 mm. Therefore, a component whose spatial wavelength is shorter than the pitch cannot be measured by the interferometer. The component in the case of degree m of 26 or more has a large error. When the component in the case of degree m of 26 or more is also managed, the influence of the error is received. Thus, there is a fear that a photomask with good pattern overlaying accuracy (OPD) cannot be obtained.

Therefore, in this embodiment, the flatness of a low-order component is suppressed to be 20 nm or less in the central area 121 of the adsorption surface 12. In this description, the low-order component is a component obtained by summing all $a_{kl}P_k(x)P_l(y)$ in the case of degree m of 3 or more and 25 or less. In addition, the flatness of the low-order component is a maximum height difference in the z direction of the low-order component.

When the flatness of the low-order component is 20 nm or less in the central area 121 of the adsorption surface 12, the pattern overlaying accuracy (OPD) can be improved, as will be described in the section of Examples. In the central area 121, the flatness of the low-order component is preferably 18 nm or less, and more preferably 16 nm or less.

The mask blank 10 is obtained by forming various films on/above the glass substrate 20 by deposition, and warped slightly due to stress caused by the deposition of the films. The warped shape is mainly expressed by the component in the case of degree m of 2, but substantially does not include the component in the case of degree m of 3 or more.

Thus, the flatness of the low-order component in the second main surface 22 of the glass substrate 20 is substantially as high as the flatness of the low-order component in the main surface 72 of the conductive film 70 formed on the second main surface 22, on the opposite side to the glass substrate 20 (that is, the adsorption surface 12 of the mask blank 10).

Figure 7:
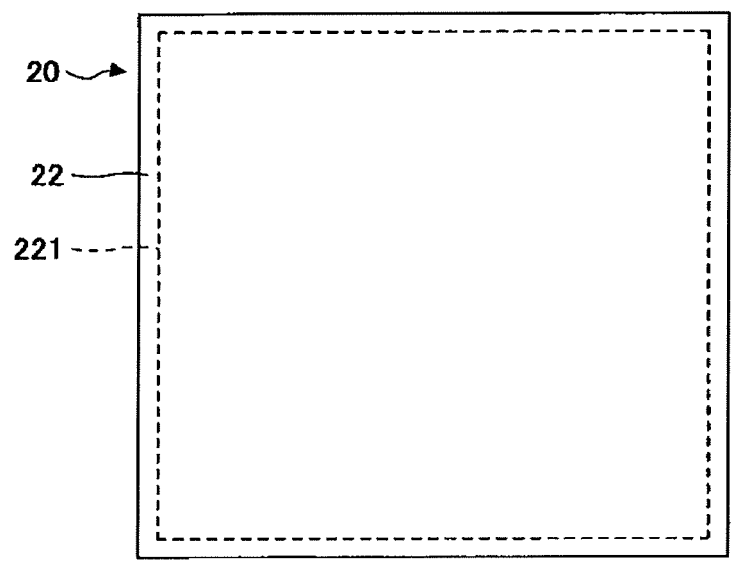
FIG. 7 is a plan view of a second main surface of a glass substrate in one embodiment.

Accordingly, in a central area 221 (see FIG. 7) of the second main surface 22 of the glass substrate 20, the flatness of the low-order component is, for example, 20 nm or less. In the central area 221, the flatness of the low-order component is preferably 18 nm or less, and more preferably 16 nm or less.

The second main surface 22 of the glass substrate 20 has, for example, a rectangular or square shape of 152 mm in length and 152 mm in width. In the main surface 22, a square area having a length of 142 mm and a width of 142 mm excluding a four-sided frame-shaped peripheral area is referred to as a central area 221. The center of the central area 221 coincides with the center of the second main surface 22.

The longitudinal dimension of the second main surface 22 of the glass substrate 20 may be 152 mm or more. The transversal dimension of the second main surface 22 of the glass substrate 20 may be 152 mm or more. Even in these cases, in the second main surface 22, the square area having a length of 142 mm and a width of 142 mm excluding the peripheral area is called a central area 221.

<Surface Shape of Circuit Pattern-Forming Surface of Mask Blank>

Figure 8:
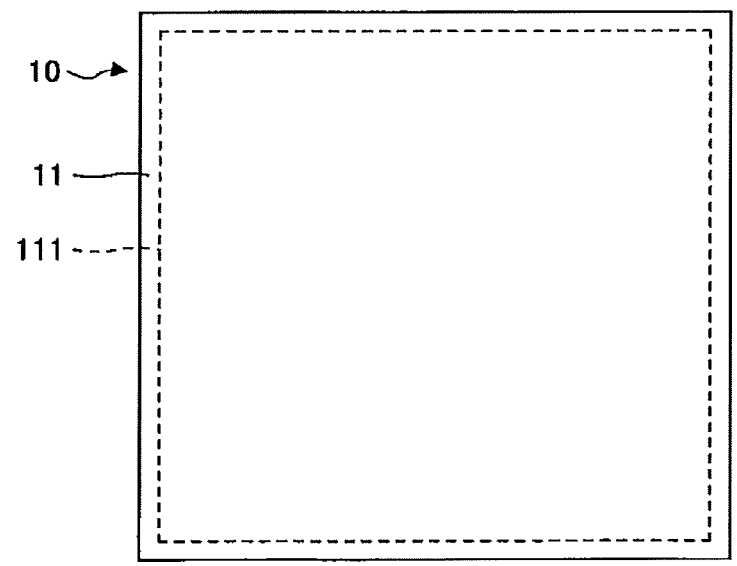
FIG. 8 is a plan view of a circuit pattern-forming surface of the mask blank in one embodiment.

FIG. 8 shows a plan view of a circuit pattern-forming surface of the mask blank in one embodiment. As illustrated in FIG. 8, the circuit pattern-forming surface 11 of the mask blank 10 is rectangular or square.

The circuit pattern-forming surface 11 has, for example, a rectangular or square shape of 152 mm in length and 152 mm in width. In the circuit pattern-forming surface 11, a square area having a length of 142 mm and a width of 142 mm excluding a four-sided frame-shaped peripheral area is referred to as a central area 111. The center of the central area 111 coincides with the center of the circuit pattern-forming surface 11.

The longitudinal dimension of the circuit pattern-forming surface 11 may be 152 mm or more. The transversal dimension of the circuit pattern-forming surface 11 may be 152 mm or more. Even in these cases, in the circuit pattern-forming surface 11, the square area having a length of 142 mm and a width of 142 mm excluding the peripheral area is called a central area 111.

The surface shape of the central area 111 of the circuit pattern-forming surface 11 is expressed by a Legendre polynomial in the same manner as the surface shape of the central area 121 of the adsorption surface 12.

In this embodiment, in the central area 111 of the circuit pattern-forming surface 11, the flatness of the low-order component is, for example, 20 nm or less. In the central area 111, the flatness of the low-order component is preferably 18 nm or less, and more preferably 16 nm or less.

The mask blank 10 is obtained by forming various films on/above the glass substrate 20 by deposition, and warped slightly due to stress caused by the deposition of the films. The warped shape is mainly expressed by the component in the case of degree m of 2, but substantially does not include the component in the case of degree m of 3 or more.

Thus, the flatness of the low-order component in the first main surface 21 of the glass substrate 20 is substantially same as the flatness of the low-order component in the main surface 61 of the low reflective film 60 formed on the first main surface 21, on the opposite side to the glass substrate 20 (that is, the circuit pattern-forming surface 11 of the mask blank 10).

Figure 9:
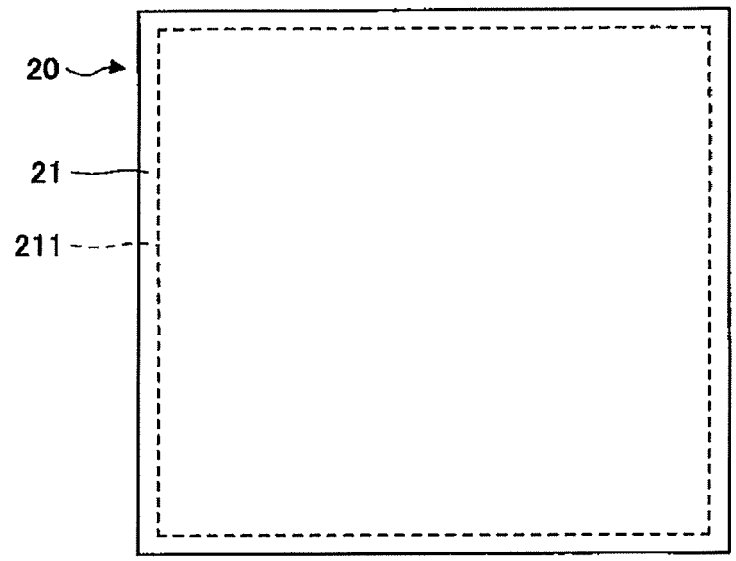
FIG. 9 is a plan view of a first main surface of the glass substrate in one embodiment.

Accordingly, in a central area 211 (see FIG. 9) of the first main surface 21 of the glass substrate 20, the flatness of the low-order component is, for example, set at 20 nm or less. In the central area 211, the flatness of the low-order component is preferably 18 nm or less, and more preferably 16 nm or less.

The first main surface 21 of the glass substrate 20 has, for example, a rectangular or square shape of 152 mm in length and 152 mm in width. In the main surface 21, a square area having a length of 142 mm and a width of 142 mm excluding a four-sided frame-shaped peripheral area is referred to as a central area 211. The center of the central area 211 coincides with the center of the first main surface 21.

The longitudinal dimension of the first main surface 21 of the glass substrate 20 may be 152 mm or more. The transversal dimension of the first main surface 21 of the glass substrate 20 may be 152 mm or more. Even in these cases, in the first main surface 21, the square area having a length of 142 mm and a width of 142 mm excluding the peripheral area is called a central area 211.

<Method for Production of Glass Substrate>

Figure 10:
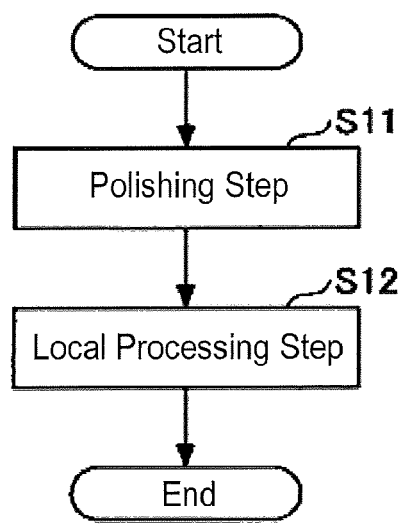
FIG. 10 is a flow chart of a method for production of the glass substrate in one embodiment.
Figure 11:
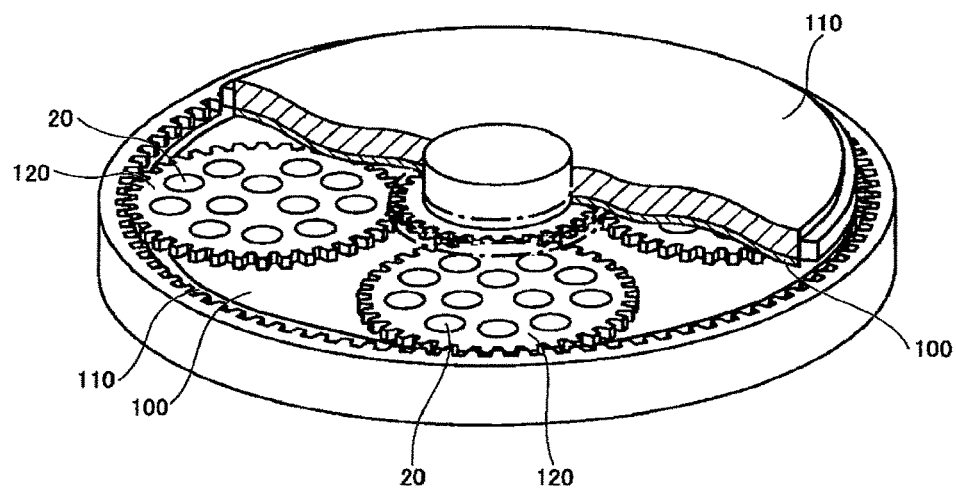
FIG. 11 is a perspective view of a polisher for polishing the glass substrate in one embodiment in a partially broken manner.
Figure 12:
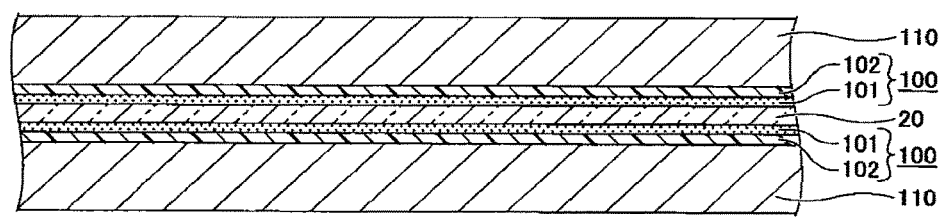
FIG. 12 is a cross-sectional view illustrating a state during polishing of the glass substrate in one embodiment.

FIG. 10 shows a flowchart of a method for production of the glass substrate in one embodiment. FIG. 11 shows a perspective view of a polisher for polishing the glass substrate in a partially broken manner. FIG. 12 shows a cross-sectional view illustrating a state during polishing of the glass substrate in one embodiment.

As illustrated in FIG. 10, the production method of the glass substrate 20 includes a polishing step S11 and a local processing step S12.

In the polishing step S11, a polishing slurry is supplied between the glass substrate 20 and a polishing pad 100 to polish the whole of the first main surface 21 and the whole of the second main surface 22. In the polishing step S11, polishing may be repeatedly performed while changing the polishing pad 100 and/or the polishing slurry.

As illustrated in FIG. 11 and FIG. 12, the polishing pad 100 may be disposed at both sides in the thickness direction of the glass substrate 20, and the first main surface 21 and the second main surface 22 may be polished at the same time. The polishing pad 100 may be disposed at one side in the thickness direction of the glass substrate 20, and the first main surface 21 and the second main surface 22 may be polished in turn. The order of polishing is not particularly limited, and either of the first main surface 21 or the second main surface 22 may be polished first.

As illustrated in FIG. 11 and FIG. 12, the polishing pad 100 is attached to a surface plate 110 in use. The polishing surface of the polishing pad 100 is larger than the first main surface 21 and the second main surface 22. The radius of the polishing surface of the polishing pad 100 may be larger than the diameter of a carrier 120 holding the glass substrate 20. In this case, the carrier 120 can be rotated around the center line of the carrier 120 while revolving around the center line of the polishing pad 100.

As the polishing pad 100, for example, a urethane-based polishing pad, a nonwoven fabric-based polishing pad, or a suede-based polishing pad is used. At least one polishing pad 100 used in the polishing step S11 has a porous resin layer 101 called a NAP layer. The resin layer 101 is formed on a base material 102 and has an opening hole in the surface to contact with the glass substrate 20.

The polishing slurry contains abrasive particles and a dispersion medium. The abrasive particles are formed of, for example, colloidal silica or cerium oxide. As the dispersion medium, water, an organic solvent, etc. is used. The polishing slurry is supplied between the polishing pad 100 and the glass substrate 20.

In the local processing step S12, the first main surface 11 and second main surface 12 of the glass substrate 20 are locally processed. In the local processing step S12, the first main surface 11 and the second main surface 12 may be processed in turn. The order of processing is not particularly limited, and either of the first main surface 11 or the second main surface 12 may be processed first.

In the local processing step S12, for example, an ion beam etching method, a gas cluster ion beam (GCIB) etching method, a plasma etching method, a wet etching method, a polishing method using a magnetic fluid, or a polishing method using a rotary polishing tool is used.

The ion beam etching method and the gas cluster ion beam etching method can change the beam irradiation position and are suitable for local correction of the surface shape. Particularly, the gas cluster ion beam etching method is preferred. The gas cluster ion beam etching method is a method using a mass (gas cluster) of gaseous atoms or molecules, which are ionized and accelerated. As the source gas of the gas cluster, gases of $SF_6$, Ar, $O_2$, $N_2$, $NF_3$, $N_2O$, $CHF_3$, $CF_4$, $C_2F_6$, $C_3F_5$, $C_4F_6$, $SiF_4$, $COF_2$, etc. can be used individually or in mixture. Among these, $SF_6$ and $NF_3$ are preferred.

The polishing method using a magnetic fluid is a method using a magnetic fluid containing abrasive particles. The magnetic fluid is, for example, a fluid in which a non-colloidal magnetic substance is dispersed in a carrier and rheology properties (viscosity, elasticity and plasticity) change when placed under a magnetic field. The abrasive particles are formed of, for example, silica, cerium oxide or diamond.

The polishing method using a rotary polishing tool is a method of bringing the rotary polishing tool into contact with the glass substrate 20 while rotating the tool. The polishing surface of the rotary polishing tool is smaller than the first main surface 11 and the second main surface 12. To the rotary polishing tool, a slurry containing abrasive particles is supplied. The abrasive particles are formed of, for example, silica, cerium oxide, alumina, zirconia, silicon carbide, diamond, titania or germania.

In this embodiment, the local processing step S12 and the polishing step S11 are performed in order to make the flatness of the low-order component in the central area 111 of the first main surface 11 and the flatness of the low-order component in the central area 121 of the second main surface 12 not higher than a predetermined value.

In the local processing step S12, a portion with a large height is locally processed, and the height difference between the processed portion and the unprocessed portion is thereby reduced. In the local processing step S12, out of the low-order component, the flatness of a component having a relatively long distance between a convex and a concave (a component in the case of degree m of 3 or more and 9 or less, which will be also referred to as a "3 or more and 9 or less order component") can be improved. On the other hand, out of the low-order component, the flatness of a component having a relatively short distance between a convex and a concave (a component in the case of degree m of 10 or more and 25 or less, which will be also referred to as a "10 or more and 25 or less order component") is improved by the polishing step S11.

At least one polishing pad 100 used in the polishing step S11 has a porous resin layer 101 called a NAP layer. As the resin forming the resin layer 101, for example, polyurethane or polycarbonate is used.

The 100% modulus of the resin forming the resin layer 101 is, for example, 5 MPa or more. The 100% modulus indicates the tensile stress with which the elongation of a specimen reaches 100% of the original length of the specimen, and the tensile stress is measured in conformity with Japanese Industrial Standards (JIS K 6250 3.7). The 100% modulus of the resin is measured in the state where the resin has no hole.

When the 100% modulus of the resin forming the resin layer 101 is 5 MPa or more, the resin layer 101 is so hard that the flatness of the 10 or more and 25 or less order component can be improved by the flat polishing surface of the resin layer 101. The 100% modulus of the resin forming the resin layer 101 is preferably 7 MPa or more.

Here, the rotating speed in the circumferential direction differs between the central part and the outer circumferential part of the rotating polishing pad 100. The difference in the polishing rate attributable to the difference in the rotating speed in the circumferential direction prominently appears as the resin layer 101 is harder, and causes deterioration in the flatness of the 3 or more and 9 or less order component.

The 100% modulus of the resin forming the resin layer 101 is, for example, 10 MPa or less. Since the resin layer 101 is not too hard, the difference in the polishing rate between the central part and the outer circumferential part of the rotating polishing pad 100 is small enough to suppress the deterioration in the flatness of the 3 or more and 9 or less order component. The 100% modulus of the resin forming the resin layer 101 is preferably 8 MPa or less.

When the polishing pad 100 whose 100% modulus satisfies the aforementioned numerical value range is used for polishing, it is preferable to use a polishing slurry containing cerium oxide. The polishing rate of a polishing slurry containing colloidal silica is lower than the polishing rate of the polishing slurry containing cerium oxide. When the polishing slurry containing colloidal silica is used, there is a fear that the flatness of the 10 or more and 25 or less order component cannot be improved.

In this embodiment, as described above, the flatness of the 10 or more and 25 or less order component is improved while suppressing deterioration in the flatness of the 3 or more and 9 or less order component in the polishing step S11, and the flatness of the 3 or more and 9 or less order component is thereafter improved in the local processing step S12.

The production method of the glass substrate 20 may further include a step other than the polishing step S11 and the local processing step S12.

For example, the production method of the glass substrate 20 may further include a finish polishing step. In the finish polishing step, after the local processing step S12, the whole of the first main surface 11 or the whole of the second main surface 12 is polished in the same manner as in the polishing step S11. In the finish polishing step, the polishing conditions are set so as not to again deteriorate the flatness of the 3 or more and 9 or less order component.

In addition, the production method of the glass substrate 20 may further include a washing step. In the washing step, the glass substrate 20 is washed. The washing step is performed, for example, between the polishing step S11 and the local processing step S12, between the local processing step S12 and the finish polishing step, or after the finish polishing step.

EXAMPLES

In Cases 1 to 4, glass substrates were produced under the same conditions except for the 100% modulus (see Table 1) of the NAP layer-forming resin used in the second polishing step described below, and the flatness was measured in the central areas of the first main surface and second main surface of each obtained glass substrate.

After that, a reflective film, a protective film, an absorbing film and a low reflective film were formed in this order on/above the first main surface of each glass substrate, and a conductive film was formed on the second main surface of the glass substrate. In this manner, a mask blank was manufactured. The reflective film, the protective film, the absorbing film and the low reflective film were formed under the same conditions among Cases 1 to 4. Cases 1 and 2 are inventive examples, and Cases 3 and 4 are comparative examples.

[Production of Glass Substrate]

In the production of the glass substrate, a polishing step, a local processing step, and a finish polishing step were performed in this order. In the polishing step, a first polishing step, a second polishing step, and a third polishing step were performed in this order. Each step will be described below.

The polishing amount in the polishing step was calculated using a change in weight of the substrate before and after polishing and the specific gravity of the glass. In addition, the polishing amount on one side was calculated as follows. That is, a glass substrate having a small hole in its surface was prepared, and a difference in depth of the hole before and after polishing was calculated.

[First Polishing Step]

In the first polishing step, two main surfaces of the glass substrate were simultaneously polished using a double-side polishing machine illustrated in FIG. 11. In addition, the substrate was mounted so that the first main surface faced a lower surface plate. In the first polishing step, the following polishing slurry and the following polishing pad were used.

Polishing slurry: An aqueous solution containing abrasive particles which had an average particle diameter of 1.5 μm and were composed of cerium oxide Polishing pad: A urethane-based polishing pad Polishing time: 70 minutes Polishing amount: 50 μm on both sides After the first polishing step, a washing step was performed before the second polishing step.

[Second Polishing Step]

In the second polishing step, two main surfaces of the glass substrate were simultaneously polished using a double-side polishing machine illustrated in FIG. 11. In addition, the substrate was mounted so that the first main surface faced a lower surface plate. In the second polishing step, the following polishing slurry and the following polishing pad were used.

Polishing slurry: An aqueous solution containing abrasive particles which had an average particle diameter of 1.0 μm and were composed of cerium oxide Polishing pad: A polishing pad composed of a polyethylene terephthalate base material and a NAP layer formed on the base material Polishing time: 60 minutes Polishing amount: shown in Table 1

After the second polishing step, a washing step was performed before the third polishing step.

[Third Polishing Step]

In the third polishing step, two main surfaces of the glass substrate were simultaneously polished using a double-side polishing machine illustrated in FIG. 11. In addition, the substrate was mounted so that the first main surface faced a lower surface plate. In the third polishing step, the following polishing slurry and the following polishing pad were used.

Polishing slurry: An aqueous solution containing abrasive particles which had an average particle diameter of 30 nm and were composed of colloidal silica, and were adjusted to have a pH of 3

Polishing pad: A super-soft polisher

Polishing time: 60 minutes

Polishing amount: 1 μm on both sides

After the third polishing step, a washing step was performed before the local processing step.
[Local Processing Step]
In the local processing step, two main surfaces of the glass substrate were locally processed in turn by using a single-side polishing machine. In the local processing step, the following polishing slurry and the following polishing pad were used.

Polishing slurry: An aqueous solution containing abrasive particles which had an average particle diameter of 1.0 μm and were composed of cerium oxide Polishing pad: A soft polisher After the local processing step, a washing step was performed before the finish polishing step.
[Finish Polishing Step]
In the finish polishing step, two main surfaces of the glass substrate were simultaneously polished using a double-side polishing machine illustrated in FIG. 11. In the finish polishing step, the following polishing slurry and the following polishing pad were used.

Polishing slurry: An aqueous solution containing abrasive particles which had an average particle diameter of 30 nm and were composed of colloidal silica, and were adjusted to have a pH of 3

Polishing pad: A super-soft polisher

Polishing time: 30 minutes

Polishing amount: 500 nm

After the finish polishing step, a washing step was performed before measurement of the flatness.
[Measurement of Flatness]
The flatness in the central area of each of two main surfaces of the glass substrate was measured by a flatness measuring device manufactured by Fujinon Corporation. Here, in order to exclude the effect of gravity, measurement was performed on the glass substrate which was erected substantially perpendicularly. The outline of the measured surface was obtained by the flatness measuring device, and from the obtained outline, a PV value of all the components in the case of degree m of 2 or more (that is, raw data), a PV value of all the components excluding the second order component, and a PV value of the low-order component were measured.

The result of the measured flatness is shown in Table 1 together with the 100% modulus and the polishing amount in the second polishing step.

ponent in the central area of the first main surface was 27.9 nm, and the PV value of the low-order component in the central area of the second main surface was 16.5 nm. Under the polishing conditions set here, the polishing amount of the second main surface was larger than the polishing amount of the first main surface. Accordingly, the PV value of the low-order component in the central area of the second main surface was sufficiently reduced. On the other hand, in the first main surface, it is considered that the PV value of the low-order component was high because the flatness as to the 10 or more and 25 or less order component out of the low-order component was not sufficiently improved.

In Case 2, as a result of the use of the pad whose 100% modulus was 8 MPa, the PV value of the low-order component in the central area of the first main surface was 18.9 nm, and the PV value of the low-order component in the central area of the second main surface was 15.8 nm. It is considered that this is because the flatness of the low-order component was improved in both the central area of the first main surface and the central area of the second main surface as the result of the use of the pad whose 100% modulus was an optimal value.

In Case 3, as a result of the use of the pad whose 100% modulus was 3 MPa, the PV value of the low-order component in the central area of the first main surface was 27.0 nm, and the PV value of the low-order component in the central area of the second main surface was 23.9 nm. It is considered that this is because the value of the 100% modulus was too low to sufficiently improve the flatness of the 10 or more and 25 or less order component, out of the low-order component, not only in the first main surface but also in the second main surface where the polishing amount was relatively larger than that in the first main surface.

In Case 4, as a result of the use of the pad whose 100% modulus was 14 MPa, the PV value of the low-order component in the central area of the first main surface was 28.8 nm, and the PV value of the low-order component in the central area of the second main surface was 22.7 nm. It is considered that this is because the value of the 100% modulus was so high that the flatness of the 3 or more and 9 or less order component, out of the low-order component, deteriorated as compared with that before polishing.
[Deposition of Conductive Film]
A CrN film as the conductive film was deposited by using a magnetron sputtering method. The CrN film had a sheet resistance of 100 Ω/square. Deposition conditions of the CrN film will be shown below.

TABLE 1

| | Second polishing step | | | Glass substrate | | | | | |
|---|---|---|---|---|---|---|---|---|---|
| | | | | Central area of first main surface | | | Central area of second main surface | | |
| | | | | PV value of | | | PV value of | | |
| | 100% modulus [MPa] | Polishing amount of first main surface [μm] | Polishing amount of second main surface [μm] | PV value of all components [nm] | all components excluding second order component [nm] | PV value of low-order component [nm] | PV value of all components [nm] | all components excluding second order component [nm] | PV value of low-order component [nm] |
| Case 1 | 5 | 7 | 14 | 36.9 | 34.2 | 27.9 | 32.4 | 29.9 | 16.5 |
| Case 2 | 8 | 9 | 15 | 38.2 | 32.4 | 18.9 | 36.9 | 33.2 | 15.8 |
| Case 3 | 3 | 6 | 11 | 35.3 | 31.8 | 27.0 | 35.1 | 28.6 | 23.9 |
| Case 4 | 14 | 10 | 17 | 35.0 | 31.0 | 28.8 | 35.2 | 32.1 | 22.7 |

In Case 1, as a result of the use of the pad whose 100% modulus was 5 MPa, the PV value of the low-order com- Deposition conditions of Cr film:
Target: Cr target
Sputtering gas: A mixed gas of Ar, $N_2$ and $H_2$ (Ar: 58.2 vol %, $N_2$: 40 vol %, $H_2$: 1.8 vol %, gas pressure: 0.1 Pa)
Input power: 1,500 W
Deposition rate: 0.18 nm/sec
Film thickness: 185 nm

[Deposition of Reflective Film]

An Mo/Si multilayer reflective film as the reflective film was deposited by using an ion beam sputtering method. In this deposition, deposition of an Mo layer and deposition of an Si layer were alternately repeated by 50 cycles. The thickness of each Mo layer was 2.3 nm, the thickness of each Si layer was 4.5 nm, and the thickness of the Mo/Si multilayer reflective film was 340 nm. The deposition conditions of the Mo layer and the Si layer will be shown below.

Deposition Conditions of Mo Layer:
Target: Mo target
Sputtering gas: Ar gas (gas pressure: 0.02 Pa)
Voltage: 700 V
Deposition rate: 0.064 nm/sec
Film thickness: 2.3 nm Deposition conditions of Si layer:
Target: Si target (boron-doped)
Sputtering gas: Ar gas (gas pressure: 0.02 Pa)
Voltage: 700 V
Deposition rate: 0.077 nm/sec
Film thickness: 4.5 nm

[Deposition of Protective Layer]

An Ru layer as the protective layer was deposited by using an ion beam sputtering method. The deposition conditions of the Ru layer will be shown below.

Deposition Conditions of Ru Layer:
Target: Ru target
Sputtering gas: Ar gas (gas pressure: 0.02 Pa)
Voltage: 700 V
Deposition rate: 0.052 nm/sec
Film thickness: 2.5 nm

[Deposition of Absorbing Film]

A TaN layer as the absorbing film was deposited by using a magnetron sputtering method. The deposition conditions of the TaN layer will be shown below.

Deposition Conditions of TaN Layer:
Target: Ta target
Sputtering gas: A mixed gas of Ar and $N_2$ (Ar: 86 vol %, $N_2$: 14 vol %, gas pressure: 0.3 Pa)
Input power: 150 W
Deposition rate: 7.2 nm/min
Film thickness: 60 nm

[Deposition of Low Reflective Film]

A TaON layer as the low reflective film was deposited by using a magnetron sputtering method. The deposition conditions of the TaON layer will be shown below.

Deposition Conditions of TaON Layer:
Target: Ta target
Sputtering gas: A mixed gas of Ar, $O_2$ and $N_2$ (Ar: 49 vol %, $O_2$: 37 vol %, $N_2$: 14 vol %, gas pressure: 0.3 Pa)
Input power: 250 W
Deposition rate: 2.0 nm/min
Film thickness: 8 nm

[Measurement of Flatness in Mask Blank]

The flatness in the central area of each main surface of the mask blank was measured by a flatness measuring device manufactured by Fujinon Corporation. Here, in order to exclude the effect of gravity, measurement was performed on the mask blank which was erected substantially perpendicularly. The outline of the measured surface was obtained by the flatness measuring device, and from the obtained outline, a PV value of all the components, a PV value of all the components excluding the second order component, and a PV value of the low-order component were calculated.

[Calculation of Flatness During Electrostatic Adsorption]

The circuit pattern-forming surface of the mask blank during electrostatic adsorption was obtained on the assumption that the adsorption surface of the mask blank was perfectly flat. Specifically, a displacement required for making the adsorption surface of the mask blank flat was calculated at each measurement point, and the displacement calculated at each measurement point was applied to the circuit pattern-forming surface of the mask blank. Thus, the outline of the circuit pattern-forming surface of the mask blank during electrostatic adsorption was obtained. In addition, the PV value of all the components was calculated from the obtained outline of the circuit pattern-forming surface.

[Calculation of Pattern Overlaying Accuracy]

The pattern overlaying accuracy (OPD) was calculated by the method disclosed in a non-patent literature (N. Harned, et al., "EUV Mask flatness compensation in writing and exposure tools relating to total overlay", 2007 International EUVL Symposium). More specifically, the pattern overlaying accuracy (OPD) was calculated as a product of the PV value of all the components in the central area of the circuit pattern-forming surface of the mask blank during electrostatic adsorption, the tangent (specifically, tan 6°) of an incident angle of exposure light, and a reduction rate (specifically, ¼) in exposure. The pattern overlaying accuracy (OPD) expresses magnitude of misalignment of a pattern from that in an ideal plane where the aforementioned flatness in the central area is zero. The smaller the OPD is, the smaller the misalignment is.

Results of tests and calculations are shown in Table 2. In Table 2 and the following description, the "PV value during electrostatic adsorption" is a PV value of all the components in the central area of the circuit pattern-forming surface of the mask blank during electrostatic adsorption.

TABLE 2

| | Mask blank | | | | | | | |
|---|---|---|---|---|---|---|---|---|
| | Central area of circuit pattern-forming surface | | | Central area of adsorption surface | | | | |
| | PV value of all components [nm] | PV value of all components excluding second order component [nm] | PV value of low-order component [nm] | PV value of all components [nm] | PV value of all components excluding second order component [nm] | PV value of low-order component [nm] | PV value during electrostatic adsorption [nm] | OPD [nm] |
| Case 1 | 110.7 | 34.2 | 27.9 | 115.6 | 29.9 | 16.5 | 29.8 | 0.78 |
| Case 2 | 105.3 | 32.4 | 18.9 | 106.9 | 33.2 | 15.8 | 21.4 | 0.56 |

TABLE 2-continued

| | Mask blank | | | | | | |
|---|---|---|---|---|---|---|---|
| | Central area of circuit pattern-forming surface | | | Central area of adsorption surface | | | |
| | PV value of all components [nm] | PV value of all components excluding second order component [nm] | PV value of low-order component [nm] | PV value of all components [nm] | PV value of all components excluding second order component [nm] | PV value of low-order component [nm] | PV value during electrostatic adsorption [nm] | OPD [nm] |
| Case 3 | 121.4 | 31.8 | 27.0 | 114.2 | 28.6 | 23.9 | 35.9 | 0.94 |
| Case 4 | 108.9 | 31.0 | 28.8 | 102.1 | 32.1 | 22.7 | 33.2 | 0.87 |

As is apparent from Table 2, in Cases 1 and 2 where the flatness of the low-order component in the central area of the second main surface of the glass substrate was 20 nm or less (see Table 1) differently from Cases 3 and 4, the flatness of the low-order component in the central area of the adsorption surface of the mask blank was 20 nm or less. As a result, the PV value during electrostatic adsorption could be made not larger than 30 nm, and the pattern overlaying accuracy (OPD) could be made not higher than 0.80. That is, it is found that there is a high correlation between the flatness of the low-order component in the central area of the adsorption surface of the mask blank, and the pattern overlaying accuracy (OPD).

On the other hand, it is found from Table 2 that there is not always a high correlation between the PV value of all the components excluding the second order component (that is, the PV value of all the components in the case of degree m of 3 or more) in the central area of the adsorption surface of the mask blank, and the pattern overlaying accuracy (OPD). As a result, there is a fear that a photomask with good pattern overlaying accuracy (OPD) cannot be obtained even if the PV value including a component in the case of degree m of 26 or more is controlled in the central area of the adsorption surface of the mask blank.

Further, as apparent from Table 2, in Case 2 where the flatness of the low-order component in the central area of the first main surface of the glass substrate was 20 nm or less (see Table 1), the flatness of the low-order component in the central area of the circuit pattern-forming surface of the mask blank was 20 nm or less. As a result, the PV value during electrostatic adsorption could be made not larger than 25 nm, and the pattern overlaying accuracy (OPD) could be made not higher than 0.60.

Although the embodiments of the mask blank have been described above, the present invention is not limited to the embodiments, but various variations or improvements can be made without departing from the gist of the present invention defined by the scope of claims.

DESCRIPTION OF REFERENCE NUMERALS AND SIGNS

10 Mask blank
11 First main surface (circuit pattern-forming surface)
12 Second main surface (adsorption surface)
20 Glass substrate
21 First main surface
22 Second main surface
30 Reflective film
40 Protective film
50 Absorbing film
60 Low reflective film
70 Conductive film

The invention claimed is:

1. A mask blank comprising:
a glass substrate including a first main surface and a second main surface facing the first main surface;
a circuit-forming film formed above the first main surface, the circuit-forming film being a film where a circuit pattern is to be formed and comprising an absorbing film that absorbs light;
a reflective film that reflects the light, provided between the absorbing film and the glass substrate; and
a conductive film formed on the second main surface; wherein:
the conductive film has a chucking surface on an opposite side to the glass substrate;
the chucking surface has a square central area having a length of having a length of 142 mm and a width of 142 mm at the center of the chucking surface; and
when a surface shape z(x, y) of the square central area of the chucking surface is expressed by the following formula, a flatness of the square central area of the chucking surface obtained by summing all $a_{kl}P_k(x)P_l(y)$ with the sum of k and l in the following formula being 3 or more and 25 or less is 20 nm or less:

$$\begin{cases} z(x, y) = \sum_{k=0}^{N_1} \sum_{l=0}^{N_2} a_{kl} P_k(x) P_l(y) \\ P_k(x) = \frac{1}{2^k k!} \frac{d^k}{dx^k}\left[(x^2 - 1)^k\right] \\ P_l(y) = \frac{1}{2^l l!} \frac{d^l}{dy^l}\left[(y^2 - 1)^l\right] \end{cases}$$

wherein x indicates a coordinate in a transverse direction, y indicates a coordinate in a longitudinal direction, and z indicates a coordinate in a height direction, the transverse direction, the longitudinal direction and the height direction being perpendicular to each other, and each of k and l is a natural number of 0 or more and 25 or less, the sum of k and l is 3 or more and 25 or less, and each of N1 and N2 is 25.

2. The mask blank according to claim 1, wherein:
the circuit-forming film has a circuit-forming surface on an opposite side to the glass substrate;
the circuit-forming surface has a square central area having a length of having a length of 142 mm and a width of 142 mm at the center of the circuit-forming surface;
when a surface shape z(x, y) of the square central area of the circuit-forming surface is expressed by the following formula, a flatness of the square central area of the circuit-forming surface obtained by summing all $a_{kl}P_k(x)P_l(y)$ with the sum of k and l in the following formula being 3 or more and 25 or less is 20 nm or less:

$$\begin{cases} z(x, y) = \sum_{k=0}^{N_1} \sum_{l=0}^{N_2} a_{kl} P_k(x) P_l(y) \\ P_k(x) = \frac{1}{2^k k!} \frac{d^k}{dx^k}\left[(x^2 - 1)^k\right] \\ P_l(y) = \frac{1}{2^l l!} \frac{d^l}{dy^l}\left[(y^2 - 1)^l\right] \end{cases}$$

wherein x indicates a coordinate in a transverse direction, y indicates a coordinate in a longitudinal direction, and z indicates a coordinate in a height direction, the transverse direction, the longitudinal direction and the height direction being perpendicular to each other, and each of k and l is a natural number of 0 or more and 25 or less, the sum of k and l is 3 or more and 25 or less, and each of N1 and N2 is 25.

3. The mask blank according to claim 2, wherein the circuit-forming film further comprises a low reflective film, provided such that the absorbing film is positioned between the low reflective film and the reflective film.

4. The mask blank according to claim 2, further comprising a protective film provided between the absorbing film and the reflective film.

5. The mask blank according to claim 2, wherein the flatness of the square central area of the chucking surface is 18 nm or less.

6. The mask blank according to claim 5, wherein the flatness of the square central area of the circuit-forming surface is 18 nm or less.

7. The mask blank according to claim 2, wherein the flatness of the square central area of the chucking surface is 16 nm or less.

8. The mask blank according to claim 7, wherein the flatness of the square central area of the circuit-forming surface is 16 nm or less.

9. The mask blank according to claim 1, wherein the circuit-forming film further comprises a low reflective film, provided such that the absorbing film is positioned between the low reflective film and the reflective film.

10. The mask blank according to claim 1, further comprising a protective film provided between the absorbing film and the reflective film.

11. The mask blank according to claim 1, wherein the flatness of the square central area of the chucking surface is 18 nm or less.

12. The mask blank according to claim 1, wherein the flatness of the square central area of the chucking surface is 16 nm or less.

* * * * *